(12) United States Patent
Kitada

(10) Patent No.: US 8,836,122 B2
(45) Date of Patent: Sep. 16, 2014

(54) SEMICONDUCTOR DEVICE HAVING COPPER WIRING WITH INCREASED MIGRATION RESISTANCE

(75) Inventor: Hideki Kitada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 262 days.

(21) Appl. No.: 12/950,554

(22) Filed: Nov. 19, 2010

(65) Prior Publication Data

US 2011/0062589 A1    Mar. 17, 2011

Related U.S. Application Data

(63) Continuation of application No. PCT/JP2008/001579, filed on Jun. 18, 2008.

(51) Int. Cl.
  *H01L 23/48*    (2006.01)
  *H01L 23/532*   (2006.01)
  *H01L 21/768*   (2006.01)
  *H01L 23/485*   (2006.01)

(52) U.S. Cl.
  CPC .... *H01L 23/53238* (2013.01); *H01L 21/76808* (2013.01); *H01L 23/53233* (2013.01); *H01L 23/485* (2013.01); *H01L 21/76883* (2013.01); *H01L 21/76877* (2013.01)
  USPC ...................................................... 257/751

(58) Field of Classification Search
  USPC ................ 438/618–631, 637–645, 648–656, 438/683–688; 257/E21.575, E21.577, 257/E21.579
  See application file for complete search history.

(56) References Cited

U.S. PATENT DOCUMENTS

| 2005/0161825 | A1   | 7/2005  | Watanabe         |         |
|--------------|------|---------|------------------|---------|
| 2005/0245065 | A1   | 11/2005 | Motoyama         |         |
| 2005/0250328 | A1 * | 11/2005 | Fujii            | 438/687 |
| 2006/0121734 | A1   | 6/2006  | Higashi et al.   |         |
| 2006/0286797 | A1 * | 12/2006 | Zhang et al.     | 438/659 |
| 2009/0026622 | A1   | 1/2009  | Amano et al.     |         |
| 2009/0075480 | A1 * | 3/2009  | Matz et al.      | 438/694 |

FOREIGN PATENT DOCUMENTS

| EP | 1610376    | A1 | 12/2005 |
|----|------------|----|---------|
| JP | 2005-038999 | A  | 2/2005  |
| JP | 2005-251991 | A  | 9/2005  |
| JP | 2006-080234 | A  | 3/2006  |
| JP | 2006-165115 | A  | 6/2006  |
| WO | 2004/088745 | A1 | 10/2004 |
| WO | 2006/016678 | A1 | 2/2006  |

OTHER PUBLICATIONS

International Search Report of PCT/JP2008/001579, mailing date Sep. 9, 2008.

(Continued)

*Primary Examiner* — Brook Kebede
(74) *Attorney, Agent, or Firm* — Westerman, Hattori, Daniels & Adrian, LLP

(57) ABSTRACT

A semiconductor device has: a semiconductor substrate formed with a plurality of semiconductor elements, a plurality of interlevel insulating films laminated above the semiconductor substrate, including a first and a second interlevel insulating films adjacent to each other; a first wiring trench formed in the first interlevel insulating film; and a first damascene wiring including: a first barrier metal film having a diffusion preventive function, formed covering inner surface of the first wiring trench and defining a first main wiring trench; and a first main wiring layer filling the first main wiring trench, formed of first metal element, and added with second metal element having migration suppressing function, at spatially different concentration.

12 Claims, 9 Drawing Sheets

(56) References Cited

OTHER PUBLICATIONS

Partial Translation of Written Opinion of PCT/JP2008/001579, mailing date Sep. 9, 2008.

Chinese Office Action mailed Jun. 29, 2012, issued in corresponding Chinese Patent Application No. 200880129901.3.

Japanese Office Action dated Mar. 12, 2013, issued in corresponding Japanese Patent Application No. 2010-517551, with English translation (4 pages).

\* cited by examiner

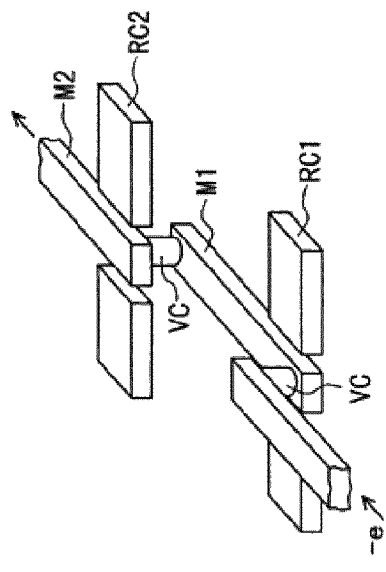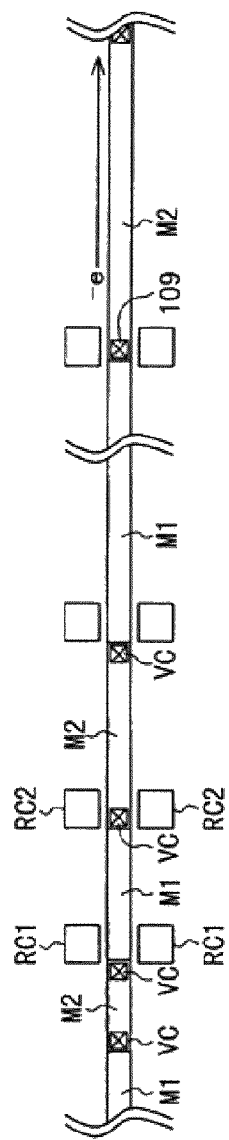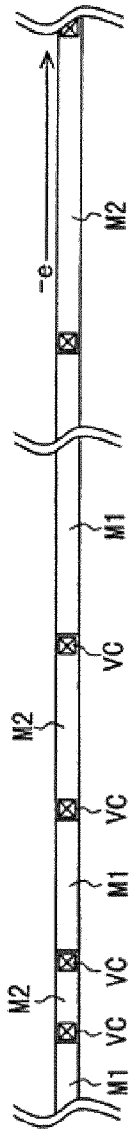
FIG. 3A
FIG. 3B
FIG. 3C

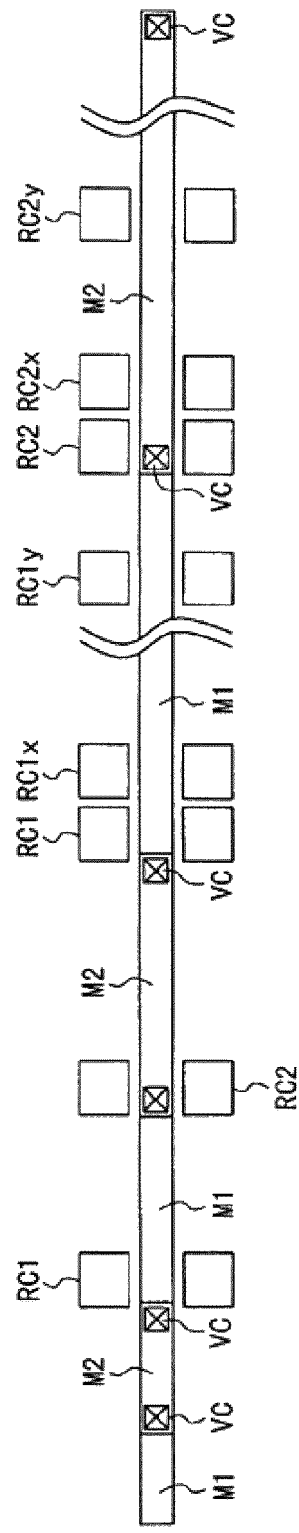

SEMICONDUCTOR DEVICE HAVING COPPER WIRING WITH INCREASED MIGRATION RESISTANCE

CROSS REFERENCE TO RELATED APPLICATION

This application is a continuation application of International Patent Application PCT/JP 2008/001579, filed in Japan on Jun. 18, 2008, the whole contents of which are incorporated herein by reference.

FIELD

The present invention relates to a semiconductor device and a method for manufacturing a semiconductor device, and more particularly to a semiconductor device having wirings doped with metal exhibiting a migration suppressing function, and a method for manufacturing a semiconductor device.

BACKGROUND

Along with higher integration of a semiconductor device and reduction in a chip area, miniaturization and further lamination of multiple wiring layers are being pursued. In logic circuits having multiple wiring layers, delay of signal propagating in wirings is becoming a dominant factor of restricting the operation speed of a logic circuit. Delay of signal propagating in wirings is related to a product of wiring resistance and parasitic capacitance between wirings. There is a tendency that a parasitic capacitance between wirings increases as wirings become finer. In order to suppress delay of signal propagation, it is effective to lower wiring resistance and reduce parasitic capacitance. In order to reduce parasitic capacitance, it is effective to use interlevel insulating films having a low dielectric constant. Known as insulating material having low dielectric constant are inorganic low dielectric constant insulating materials such as porous silica and SiOC, and organic low dielectric constant insulating materials such as SiLK (registered trademark) manufactured by the Dow Chemical Company. These materials contain silicon (Si) and oxygen (O), and have a lower dielectric constant than silicon oxide SiO.

In order to lower wiring resistance, techniques of using copper (Cu) having a low resistivity as wiring material in place of aluminum (Al) are practically used. It is difficult to pattern a copper layer at high precision by photolithography and etching. Damascene method is therefore adopted by which in general, a wiring trench is formed in an insulating film, the trench is filled with a copper layer, and an unnecessary copper layer on the insulating film is removed by chemical mechanical polishing (CMP).

There is a nature that copper diffuses into an insulating film. An insulating film containing diffused copper deteriorates its insulating characteristics. In order to prevent copper diffusion, a conductive barrier (barrier metal) layer of TiN, Ta or the like having a copper diffusion preventive function is formed in a wiring trench by sputtering or the like, and a copper seed layer for conducting electrolytic plating is formed on the conductive barrier layer by sputtering or the like. A copper layer as a main wiring layer is formed on the copper seed layer by electrolytic plating, and unnecessary metal layers on the insulating film are removed by CMP. An insulating copper diffusion preventive film of SiN, SiC or the like is formed covering the copper wiring.

Electro migration of an aluminum wiring is known in which aluminum atoms are migrated by current. It is said that electro migration occurs less in copper than in aluminum. However, electro migration occurs also in a copper wiring. Even if an aluminum wiring is replaced with a copper wiring, such a phenomenon occurs that a large current expected from a bulk value of copper cannot be allowed to flow. An insulating copper diffusion preventive film covering the upper surface of a copper wiring has low adhesion to the copper layer.

It is known that voids are formed at the interface between the copper wiring layer and insulating copper diffusion preventive film.

Although the barrier metal layer and copper wiring layer form a good interface, the insulating copper diffusion preventive film and copper wiring layer cannot form a good interface. It is considered that since the insulating copper diffusion preventive film and copper wiring layer provide poor adhesion, copper atoms at the interface are likely to move, and interface diffusion becomes likely to occur. It is considered that as copper atoms start diffusing at an interface with the insulating copper diffusion preventive film, copper atoms adjacent to a vacancy or vacant portion undergo volume movement, and as the number of copper atoms capable of undergoing volume movement becomes insufficient, the vacant portion cannot be filled with the moved copper atoms. Thus, voids are formed and grown.

In order to improve reliability of a copper wring, it is also known that silver, aluminum or the like may be added to copper to make this additive suppress atom flow and hence increase electro migration resistance.

As above, by adding metal atoms having a migration suppressing function to copper wiring, copper atom migration or diffusion along grain boundaries and interface between copper wiring and an adjacent insulating layer are suppressed, and electro migration resistance is improved. There is, however, a tendency that electric resistance of a wiring increases as impurity metal atoms are added to copper. For example, copper added with Al about 2 wt % has a electric resistivity increased by about 20 to 30% than that of pure copper.

[Patent Document 1]
  International Publication WO2004/088745
[Patent Document 2]
  JP-A-2005-38999

SUMMARY

In order to improve reliability of a wiring, it is desirous to add metal atoms having a migration suppressing function to a wiring although an increase in electric resistance value to be caused by additive is undesirous.

An object of the present invention is to provide a semiconductor device having a wiring capable of suppressing migration and improving reliability while an increase in electric resistance value is suppressed, and its manufacture method.

According to one aspect of the present invention, there is provided a semiconductor device including:
  a semiconductor substrate;
  a plurality of interlevel insulating films laminated above the semiconductor substrate, including a first and a second interlevel insulating films adjacent to each other;
  a first wiring trench formed in the first interlevel insulating film; and
  a first damascene wiring including: a first barrier metal film having a diffusion preventive function, formed covering inner surface of the first wiring trench and defining a first main wiring trench; and a first main wiring layer filling the first main wiring trench, formed of first metal element, and added with second metal element having migration suppressing function, at spatially different concentration.

According to another aspect of the present invention, there is provided a method for manufacturing a semiconductor device, including:

forming a plurality of semiconductor elements on a semiconductor substrate;

forming a first interlevel insulating film above the semiconductor substrate at a first level, the first interlevel insulating film covering the plurality of semiconductor elements;

forming a first wiring trench in the first interlevel insulating film;

forming a first barrier metal film covering inner surface of the first wiring trench, the first barrier metal film having a diffusion preventive function, and defining a first main wiring trench in the first wiring trench;

forming a first main wiring layer formed of first metal element, and filling the first main wiring trench; and locally doping second metal element having a migration suppressing function into the first main wiring layer, arranging the first main wiring layer doped with the second metal element at spatially different concentration.

By locally adding metal atoms having a migration suppressing function to a wiring, it becomes possible to effectively suppress generation of voids, while suppressing increase in electric resistance value.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE GRAWINGS

FIGS. 1A to 1H are cross sectional views and plan views illustrating processes for forming a wiring structure illustrated in FIG. 2D according to an embodiment, wherein FIGS. 1A, 1C to 1F are cross sectional views of a semiconductor substrate, and FIGS. 1B, 1G and 1H are plan views of the semiconductor substrate.

FIGS. 3A and 3B are a perspective view and a plan view illustrating a via chain structure of an example according to the embodiment, and FIG. 3C is a plan view of a via chain of a comparative example.

FIG. 4 is a plan view illustrating a via chain structure according to a modification.

DESCRIPTION OF THE PREFERRED EMBODIMENT

Along with the demand for higher integration and miniaturization of semiconductor devices, there is a tendency that the width of wirings becomes narrower and current density in the wirings increases. Migration in copper wirings in the semiconductor devices of 45 nm rule becomes non-negligible. For semiconductor devices miniaturized further, migration in a copper wiring may become a big issue. It is possible to suppress migration by adding metal atoms having migration suppressing function, such as Al and Ag, to copper wirings. It is, however, desired to avoid increase in electrical resistance to an unacceptable value by the addition of metal atoms having the migration suppressing function.

It has been found from the studies made heretofore by the inventor and his colleagues that voids are not uniformly generated in the whole region of a copper wiring, but voids are concentrated near a via conductor. It is considered that volume movement of copper atoms may occur in a copper wiring, particularly in an interface region with an insulating copper diffusion preventive film, and it is difficult for copper atoms to transmit through a barrier metal film. It is therefore considered that if electron flow after transmission through a barrier metal film of a via conductor induces volume movement of copper atoms, voids may be generated at downstream side of the via conductor because copper atoms will not be replenished with through the barrier metal film.

The inventor has planned adding metal atoms having the migration suppressing function preferentially to a region of wirings where voids are likely to be generated. For example, metal atoms having the migration suppressing function are added to the downstream side of a via conductor, with regard to the electron flow, the via conductor constituting a connection between wirings at different levels (heights). It is expected that it is possible to suppress generation of voids in the region where voids are likely to be generated, and that increase in resistance value is suppressed because the region, where the metal atoms are added, is limited to local regions of the wirings. The embodiments of the present invention will be described with reference to the accompanying drawings.

Figure 2A:
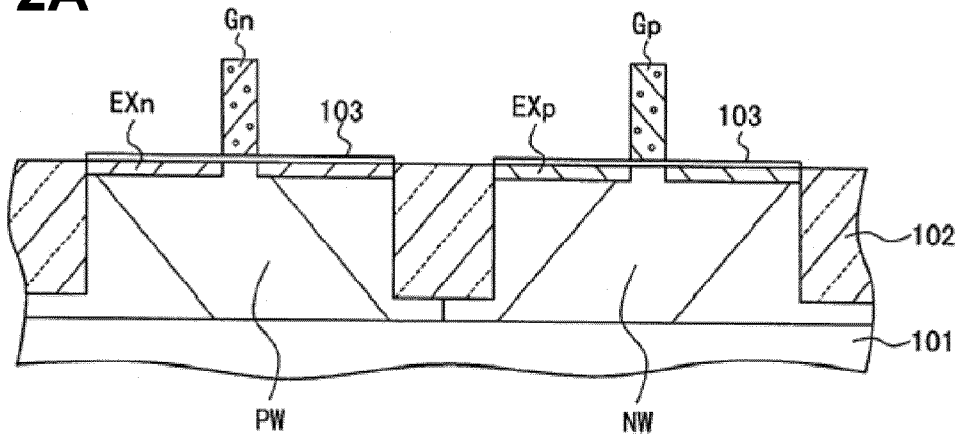
FIGS. 2A to 2C are cross sectional views illustrating processes for manufacturing a lower structure of a semiconductor device.
Figure 2B:
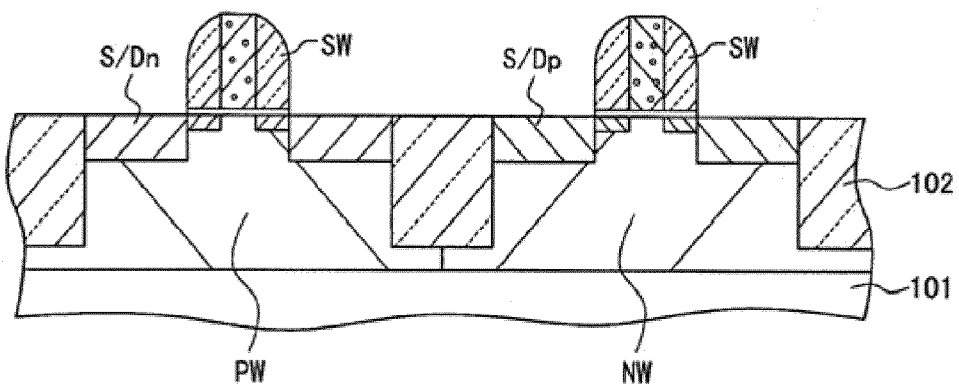
Figure 2C:
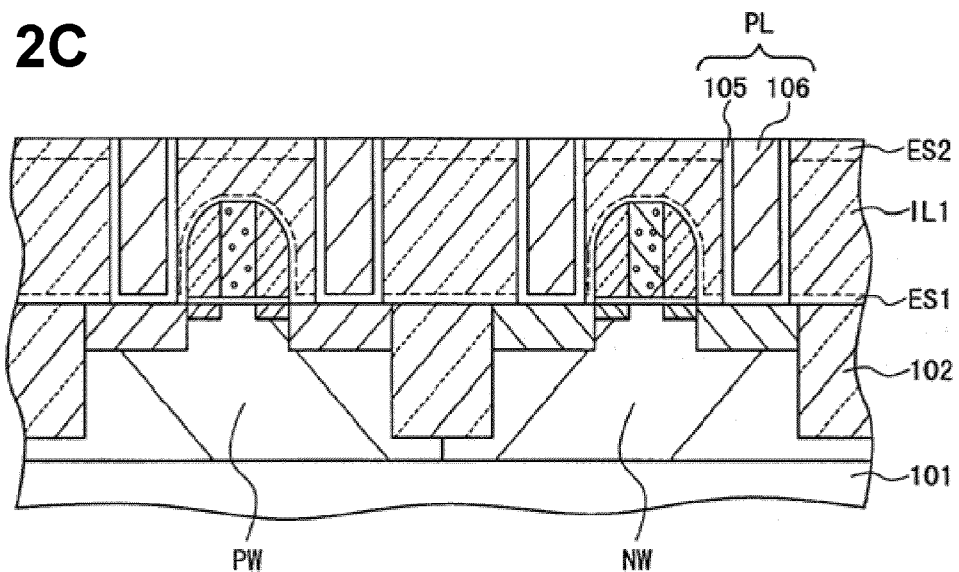

FIGS. 2A to 2C are cross sectional views of a semiconductor substrate illustrating processes for manufacturing a lower layer structure of a semiconductor device.

As illustrated in FIG. 2A, an isolation region 102 is formed in a silicon substrate 101 by shallow trench isolation (STI) to define active regions surrounded by the isolation region 102. For example, the isolation region is formed by forming isolation trench by etching, depositing a silicon oxide film in the isolation trench by high density plasma chemical vapor deposition (HDP-CVD), and annealing the silicon oxide film to make it dense. Impurity ions of p- and n-type are selectively implanted into the active regions, and activated to form p-type wells PW and n-type wells NW. The following description will be made taking an example on one p-type well and one n-type well. The p-type well PW constitutes an n-channel MOS transistor (NMOS) region, and the n-type well NW constitutes a p-channel MOS transistor (PMOS) region.

The surface of the active region is thermally oxidized to grow a silicon oxide film to a thickness of, e.g., about 1.5 nm to 10 nm, and nitrogen may be introduced into the silicon oxide film according to necessity, to form a gate insulating film 103. A silicon film of amorphous silicon or polysilicon is deposited on the gate insulating film 103 by CVD, and patterned by etching using a photoresist mask to form gate electrode patterns Gn and Gp. By selecting the NMOS region and PMOS region with photoresist patterns, n-type impurity ions are implanted shallowly into the NMOS region to form n-type extension regions EXn, and p-type impurity ions are implanted shallowly into the PMOS region to form p-type extension regions EXp. Impurities are implanted also into the gate electrodes.

As illustrated in FIG. 2B, an insulating film such as a silicon oxide film is deposited by CVD, and anisotropic etching such as reactive ion etching (RIE) is performed to leave side wall spacers SW only on side walls of the gate electrodes Gn and Gp. By selecting the NMOS region and PMOS region with photoresist patterns, n-type impurity ions are implanted deeply at a high concentration into the NMOS region to form low resistance n-type source/drain regions S/Dn, and p-type impurity ions are implanted deeply at a high concentration into the PMOS region to form low resistance p-type source/drain regions S/Dp. Impurities are implanted also into the gate electrodes.

As illustrated in FIG. 2C, an etch stopper layer ES1 of SiN, SiC or the like and a lower interlevel insulating film Ill of a silicon oxide based insulating film such as phosphosilicate glass (PSG) are deposited by CVD, covering the gate electrodes, and chemical mechanical polishing (CMP) is performed to planarize the surface of the lower interlevel insulating film. Another etch stopper layer ES2 of SiC, SiN or the like may be laminated on the lower interlevel insulating film ILL according to necessity. The etch stopper layers ES1 and ES2 may be considered as part of the lower interlevel insulating film IL1. By using a photoresist mask having openings of contact hole pattern, etching is done through the etch stopper layer ES2 and lower interlevel insulating film IL1, and is stopped at the etch stopper layer ES1. The exposed etch stopper layer ES1 is then etched to form contact holes exposing the silicon surface. The photoresist mask is thereafter removed. The lower interlevel insulating film IL1 and the etch stopper layers ES1 and ES2 will be collectively called the lower interlevel insulating film IL1, hereinafter. A barrier metal film 105 of TiN or the like is formed on the inner surface of the contact hole extending through the lower interlevel insulating film IL1, and a W film 106 is blanket-grown on the barrier metal film by CVD. Unnecessary metal films on the lower interlevel insulating film lIL1 are removed by CMP. In this manner, conductive plugs PL are formed or buried in the lower interlevel insulating film IL1.

Figure 1A:
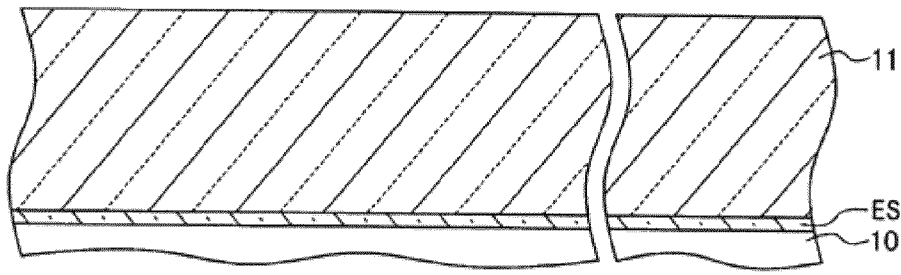
Figure 1B:
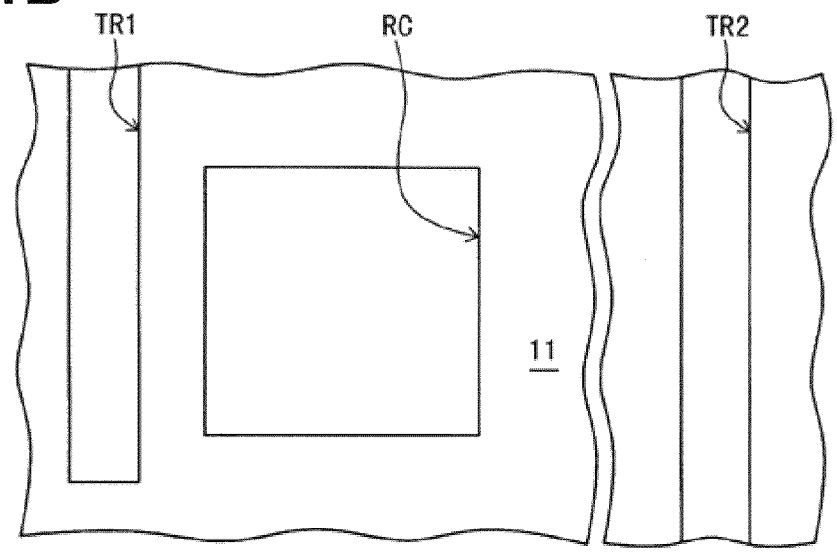
Figure 1C:
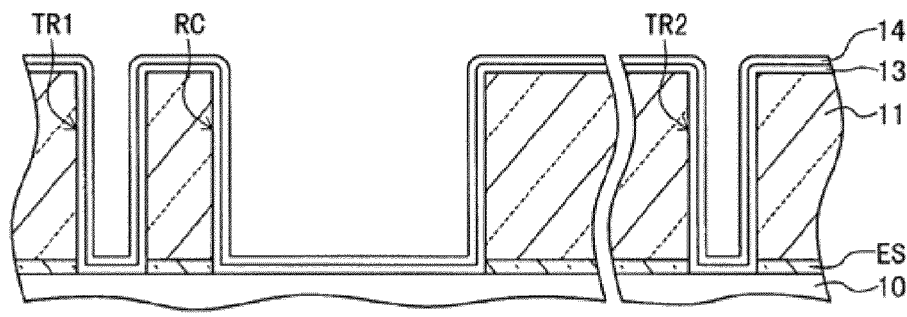
Figure 1D:
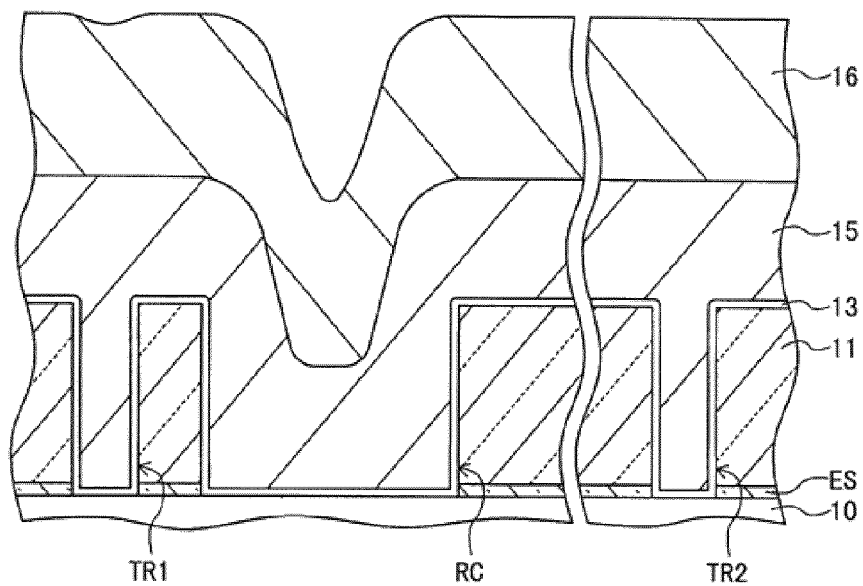
Figure 1E:
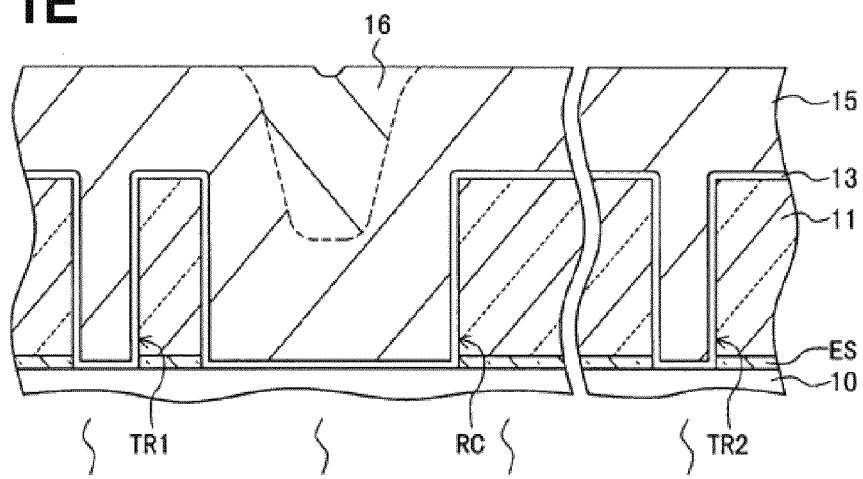
Figure 1F:
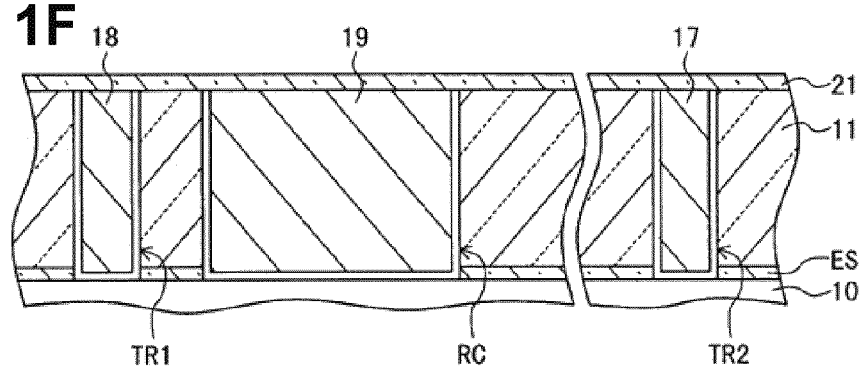
Figure 1G:
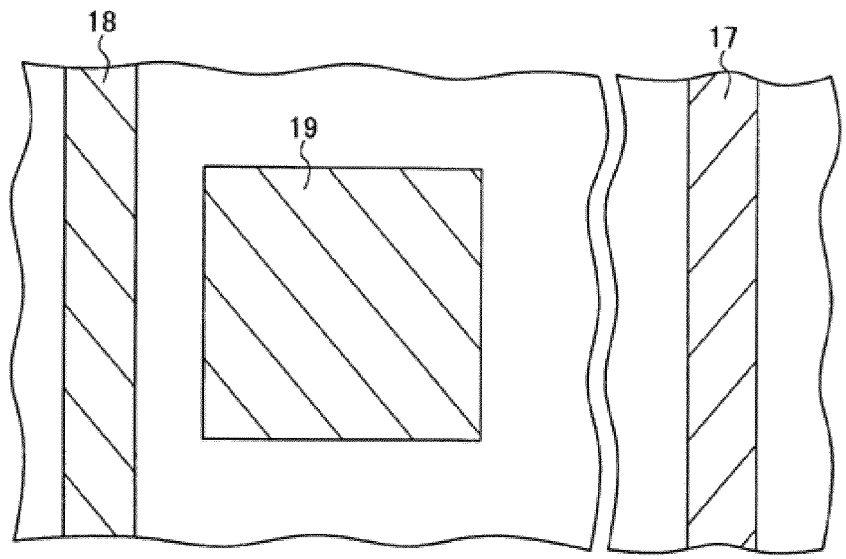
Figure 1H:
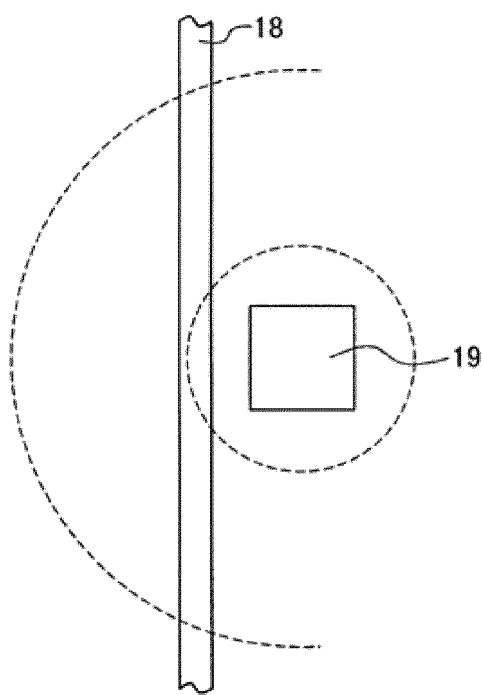
Figure 2D:
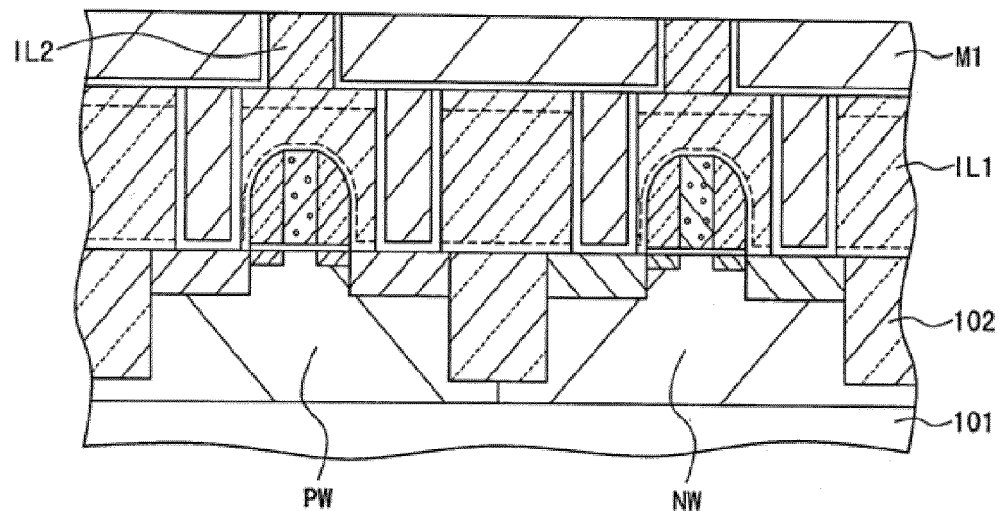
FIGS. 2D and 2E are cross sectional views illustrating processes for forming a wiring structure.

As illustrated in FIG. 2D, an interlevel insulating film IL2 is formed on the lower interlevel insulating film IL1, and first level metal wirings M1 of copper are formed or buried in the interlevel insulating film IL2. This process will be described in more detail with reference to FIGS. 1A to 1H.

As illustrated in FIG. 1A, as an etch stopper layer ES, for example, an SiC layer having a thickness of 10 nm is deposited on a lower structure 10 by CVD. Next, an interlevel insulating film 11 of SiOC is deposited to a thickness of about 300 nm by CVD. The lower structure 10 includes the semiconductor device and conductive plugs as illustrated in FIG. 2C.

As illustrated in the plan view of FIG. 1B, wiring trenches TR1 and TR2 having a width of, e.g., 90 nm and a rectangular impurity doping recess RC of 400 nm square are disposed in the interlevel insulating film 11. The wiring trench TR1 has a lower end in the plan view, and extends upward. The wiring trench TR2 has no end in the plan view, and extends downward and upward. The impurity doping recess RC is formed to have a side parallel to a side of the wiring trench TR1 near a lower end region thereof, e.g., at a distance of 90 nm from the side of the wiring trench TR1. The wiring trench TR2 is disposed sufficiently away from the impurity doping recess RC, e.g., away by four times or longer than the distance between the impurity doping recess RC and wiring trench TR1.

As illustrated in FIG. 1C, the wiring trenches TR1 and TR2 and impurity doping recess RC respectively having a depth of 300 nm are formed through the interlevel insulating film 11 by etching. A barrier metal film 13 made of, e.g., a Ta film having a thickness of about 10 nm on a field plane (flat plane) is formed by sputtering to cover the inner surfaces of the trenches and recess. A seed layer 14 having a thickness of 100 nm on a field plane is further formed by sputtering. A film thickness in the trench becomes one third or thinner because of the difference in coverage.

As illustrated in FIG. 1D, a copper wiring layer 15 is formed by electrolytic plating to a thickness of about 200 nm on a flat plane. The copper wiring layer 15 is bottom-up grown by using electrolytic plating liquid containing additives of accelerator, suppressor and leveler. With bottom-up growth, a narrow wiring is electrolytically grown with priority over a wide wiring. For example, at the time when the copper layer is formed to a thickness of about 100 nm on a flat plane, the wiring trenches TR1 and TR2 having a width of 90 nm are completely filled with the copper wiring layer. At the time when the copper layer is electrolytically plated to a thickness of about 200 nm on a flat plane, the impurity doping recess RC is not still filled completely with the copper wiring layer. A concave portion reflecting the recess RC is formed on the upper surface of the copper wiring layer 15.

For bottom-up growth, additives of an electrolytic plating liquid and the like, reference may be made to JP-A-2006-294922, paragraph [0016] etc., and Journal of the Electrochemical Society, 149(1), C74-C81 (2002), the whole contents of which are incorporated herein by reference.

An Al-doped copper layer 16 doped with Al at 1.0 wt % is formed on the copper wiring layer 15 to a thickness of about 500 nm, e.g., by physical vapor deposition (PVD). Al doped in the copper layer has function of suppressing migration. The Al-doped copper layer may 16 be formed by a method other than PVD, such as plating and CVD.

As illustrated in FIG. 1E, CMP is performed from the upper surface of the Al-doped copper layer 16 until the Al-doped copper layer 16 disappear on the flat plane and above the wiring trenches. The copper wiring layer 15 is left to a thickness of about 200 nm on the flat plane. The Al-doped copper layer 16 is left in a concave portion above the impurity doping recess RC. In the state that the Al-doped copper layer 16 is left only above the impurity doping recess RC. Then, heat treatment is performed to diffuse Al. For example, an anneal process (heat treatment) is performed at 350° C. for 3 minutes. Diffusion of Al from the Al-doped copper layer 16 into the copper wiring layer 15 progresses rapidly, and Al is diffused into the copper wiring layer 15 near the impurity doping recess RC. Al is diffused also into the copper wiring layer 15 in the wiring trench TR1.

As Al diffuses, the border between the Al-doped copper layer 16 and copper wiring layer 15 may disappear. Both the layers are collectively called a copper layer 15, hereinafter. The wiring trench TR2 does not receive substantial diffusion of Al because the wiring trench TR2 is sufficiently away from the impurity doping recess RC.

As illustrated in FIG. 1F, CMP is performed from the upper surface of the copper layer 15 to expose the surface of the interlevel insulating film 11. A damascene wiring layer 18 including an Al-diffused copper layer is buried in the wiring trench TR1. A damascene wiring layer 17 including a copper layer without substantial diffusion of Al is buried in the wiring trench TR2. A damascene structure 19 including a copper layer having a higher Al concentration than that of the copper layer of the damascene wiring layer 18 is buried in the impurity doping recess RC. After CMP, an insulating copper diffusion preventive film 21 of SiC, SiN or the like is deposited on the interlevel insulating film 11 by CVD or the like, covering the damascene wiring layers and damascene structure.

FIG. 1G is a plan view illustrating the layout of the damascene wirings and damascene structure. The copper damascene wiring layer 17 without Al diffusion is indicated by downward hatching to the bottom left, and the copper damascene wiring layer 18 and damascene structure 19 with Al diffusion are indicated by downward hatching to the bottom right.

As illustrated in FIG. 1H, the damascene structure 19 in the impurity doping recess may be considered as an Al diffusion source. It may consider that diffusion progresses almost omnidirectionaly and is approximated by circles. An Al concentration in the copper damascene wiring layer 18 lowers with increase in a distance from a center of the damascene structure 19. Diffusion does not arrive at the position sufficiently remote from the damascene structure 19. It can be said therefore that Al is doped into the damascene wiring only locally. An Al concentration gradient exists in the copper damascene wiring 18.

Figure 2E:
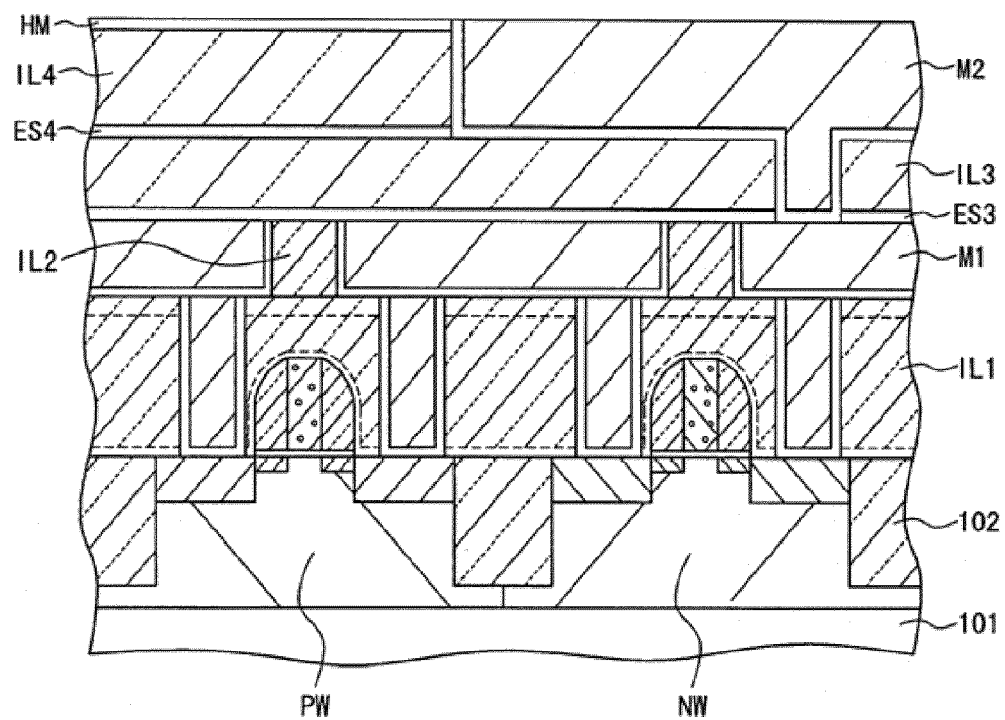

As illustrated in FIG. 2E, an etch stopper layer ES3, an interlevel insulating film IL3, an etch stopper layer ES4, an interlevel insulating film IL4 and an insulating hard mask layer HM are laminated on the interlevel insulating film IL2, covering the first level metal wiring layer M1. The etch stopper layers ES3 and ES4 are made of, e.g., SiC or SiN. The interlevel insulating layers IL3 and IL4 are made of, e.g., inorganic or organic low dielectric constant insulating material. The hard mask layer HM may be made of a lamination of a silicon oxide film and a silicon carbide (SiC) film, or the like.

A pseudo via hole is formed through the hard mask layer HM, interlevel insulating layer IL4, etch stopper layer ES4 and interlevel insulating layer IL3 by etching using a photoresist mask. The photoresist mask is removed, the pseudo via hole is filled with a filler of material similar to resist, a new photoresist mask is formed, and a pseudo wiring trench is formed through the hard mask layer HM and interlevel insulating layer IL4 by etching. The photoresist mask and filler are removed, and the etch stopper layers left on the bottom surfaces of the pseudo wiring trench and pseudo via hole are removed. The pseudo wiring trench becomes a wiring trench, and the pseudo via hole becomes a via hole. A barrier metal layer and a copper seed layer are sputtered on the side walls and bottom surfaces of the wiring trench and via hole, and a copper layer is plated on the copper seed layer. Unnecessary metal layers on the hard mask layer HM are removed by CMP to form a second level metal wiring layer M2.

These processes are similar to the general dual damascene wiring process. In addition to the usual processes, the impurity doping recess is formed near at a desired position of a wiring by the wiring trench forming process illustrated in FIG. 1B, and the processes to be added after the copper layer plating are: process of forming an Al-doped copper layer; CMP; and Al diffusion heat treatment, similar to the processes illustrated in FIGS. 1D and 1E. Wiring forming process is repeated a desired number of times. For example, reference may be made to FIGS. 7 and 8 and related description of WO2004/088745, the whole contents of which are incorporated herein by reference. In order to verify the effects of the embodiment described above, samples of a via chain were manufactured.

FIG. 3A is a perspective view schematically illustrating the structure of a via chain sample manufactured. The via chain was made of a first level copper wiring pattern M1 of a stripe shape having a width of 90 nm and a second level copper wiring pattern M2 including a stripe-shaped wiring pattern having a width of 90 nm and via conductors VC. The copper wiring patterns M1 and M2 have a shape that the side walls and bottom surfaces of the copper wirings are covered with barrier metal. Impurity doping recesses RC1 and RC2 (filled with a copper layer doped with Al) of 400 nm×400 nm are disposed on both sides of the wirings M1 and M2 at the downstream side of the via conductors VC with regard to electron flow, spaced from the wirings M1 and M2 by 90 nm. Impurity Al diffuses locally in the neighborhood of the region of the copper wiring pattern M1 (M2) sandwiched between the impurity doping recesses RC1 (RC2). Since a barrier metal film is disposed on the bottom surface of the via conductor VC, even if copper atom particles are made to move, the copper atom particles are dammed by the barrier metal film. If a copper atom flow is formed at the downstream side of the via conductor, voids may be formed. In order to suppress a copper atom flow, the impurity doping recesses RC1 and RC2 are disposed at the downstream side of the via conductors VC to add Al impurity having a migration suppressing function to the wirings M1 and M2. Since impurities are doped only in the region near the via conductor, it is expected that an increase in a wiring resistance is smaller than adding impurity to the whole wiring.

FIG. 3B is a plan view illustrating the structure of a via chain sample. A first level copper wiring M1 and a second level copper wiring M2 are connected by via conductors VC. The whole length of the via chain is about 1 mm. Three via intervals 5 µm, 20 µm, and 86 µm were set, and the numbers of via conductors were set to 4, 6, and 10, respectively. Impurity doping recesses RC1 and RC2 have a square shape of 400 nm square, and are spaced from the copper wirings M1 and M2 by 90 nm.

FIG. 3C is a plan view illustrating the shape of a via chain sample without doping impurity formed as a comparative example. As compared to the via chain sample illustrated in FIG. 3B, the via chain sample of the comparative example has the structure that impurity doping recesses RC1a and RC2a are not formed.

A remarkable increase in a wiring resistance to be caused by addition of impurity was not found from the comparison result between a resistance of the via chain with doped impurity illustrated in FIG. 3B and a resistance of the via chain without doped impurity illustrated in FIG. 3C.

Test of electro migration resistance was performed at a temperature of 200° C. and a current density of $2 \times 10^6$ Acm$^{-2}$. Electro migration resistance was evaluated by using a time T50 when a cumulative failure rate reaches 50%. As compared to the comparative sample (FIG. 3C) without impurity addition, an electro migration life time T50 of the via chain sample with impurity addition (FIG. 3B) was prolonged to about 1.5 times. It is understood that the electro migration resistance is improved by impurity addition. In the comparative sample illustrated in FIG. 3C, disconnection was found in the neighborhood of the via conductors.

Electro migration of copper is not limited only to the region near the via conductor. If a wiring is very long, there is a possibility that voids are generated at an intermediate position between via conductors.

FIG. 4 is a plan view illustrating a via chain structure according to a modification. A first level copper wiring M1 and a second level copper wiring M2 are connected by via conductors VC. The 2-level copper wirings M1 and M2 at the right are very long. In this case, not only impurity doping recesses RC1 and RC2 are disposed near the via conductors, but also impurity doping recesses RC1X, RC1Y, RC2X, and RC2Y are disposed also at intermediate positions. Even when the impurity doping recesses are disposed in the regions near intermediate positions of the wiring, impurities are doped only in limited portions of the wiring, and an increase in a wiring resistance is limited. Impurity doping is not limited only to diffusion.

Figure 5A:
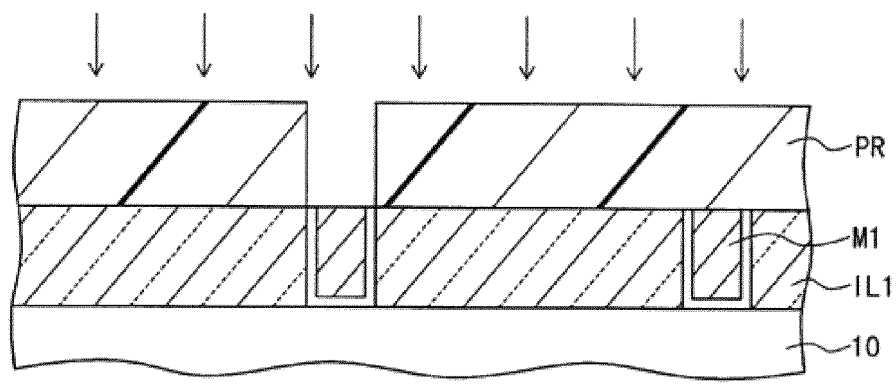
FIGS. 5A and 5B are cross sectional views illustrating processes for forming a wiring structure according to another embodiment.
Figure 5B:
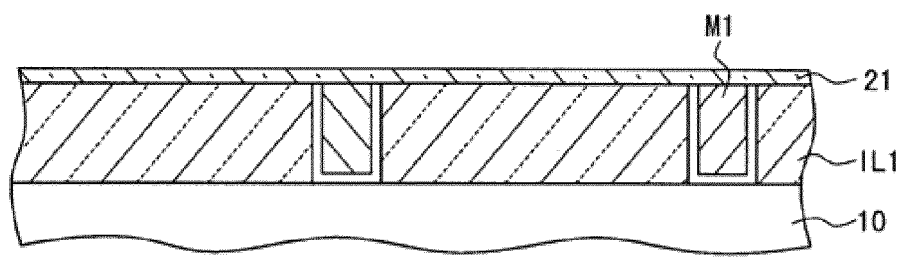

FIGS. 5A and 5B are cross sectional views of a semiconductor substrate illustrating an impurity doping process according to another embodiment.

As illustrated in FIG. 5A, an interlevel insulating film IL1 is formed on a lower structure 10, wiring trenches are formed, and the trenches are filled with a first level copper wiring M1. A photoresist pattern PR having an opening locally exposing the wiring M1 is formed on the interlevel insulating film IL1 burying the first level copper wiring M1. By using the photoresist pattern PR as a mask, impurity ions such as Al are implanted.

As illustrated in FIG. 5B, after impurity ions are implanted, the photoresist pattern PR is removed. An insulating copper diffusion preventive film 21 made of SiC or the like is formed on the interlevel insulating film IL1 covering the surfaces of the copper wirings M1. Heat treatment for diffusing implanted impurity ions is performed before or after the insulating copper diffusion preventive film is formed.

Instead of ion implantation, focused ion beam (FIB) may be used to implant impurity ions. If FIB is used, the photoresist pattern PR is not necessary.

Impurities having a migration suppressing function are not limited only to Al.

Figure 6:
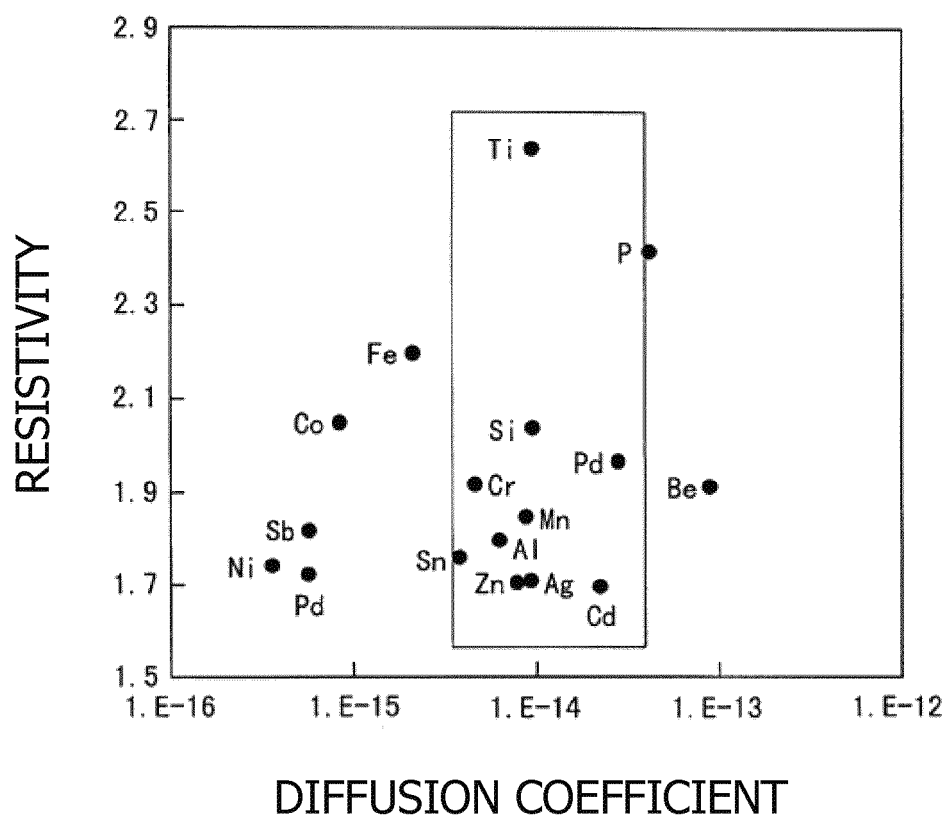
FIG. 6 is a graph illustrating diffusion coefficients of various metal impurities in copper and electric resistivities of copper added with those metal impurities at 0.05 wt %.

FIG. 6 is a graph illustrating a relation between diffusion coefficient of each of various impurity metals added to copper and resistivity of a copper film doped with impurities at 0.05 wt %. It is preferable to use one or a combination of elements appearing in a region surrounded by a rectangle in the graph, including Zn, Ag, Cd, Sn, Al, Mn, Cr, Pd, Si, and Ti, as impurities having migration suppressing function.

The present invention has been described along with the preferred embodiments. The present invention is not limited only to the embodiments. A shape of an impurity doping recess and a distance from a wiring may be changed in various ways. In order to control the doped impurity concentration, shape of an impurity doping recess, distance from a wiring, and impurity concentration in the impurity doped copper layer can be selected. Heat treatment condition for impurity diffusion may also be selected. It is obvious for those skilled in the art that various changes, improvements, combinations, and the like can be made.

What are claimed are:

1. A semiconductor device comprising:
   a semiconductor substrate;
   a plurality of interlevel insulating films laminated above the semiconductor substrate, including a first and a second interlevel insulating films adjacent to each other;
   a first wiring trench formed in the first interlevel insulating film;
   a first damascene wiring including:
      a first barrier metal film having a diffusion preventive function, formed covering inner surface of the first wiring trench and defining a first main wiring trench; and
      a first main wiring layer filling the first main wiring trench, formed of first metal element, and added with second metal element having migration suppressing function;
   a doping recess formed in the first interlevel insulating film near said first wiring trench, and having an in-plane size larger than an in-plane width of said first wiring trench in plane of the first interlevel insulating film; and
   a doping damascene structure including a doping region barrier metal film of a same material as a material of said first barrier metal film, formed covering inner surface of said doping recess, and defining a doping region recess and a doping metal region filling said doping region recess, and having a higher doping concentration of the second metal element than a doping concentration of the second metal element in said first main wiring layer,
   wherein said doping damascene structure has no circuit function, and constitutes the impurity source region, and a doping concentration of the second metal element in said first main wiring layer lowers with a distance from said doping metal region.

2. The semiconductor device according to claim 1, further comprising:
   a second wiring trench formed in the first interlevel insulating film; and
   a second damascene wiring including a second barrier metal film formed covering inner surface of said second wiring trench, defining a second main wiring trench, and made of a same material as said first barrier metal film and a second main wiring layer filling said second main wiring trench, made of the first metal element, and having a lower doping concentration of the second metal element than a doping concentration of the second metal element in said first main wiring layer.

3. The semiconductor device according to claim 2, wherein a distance between said second wiring trench and said doping recess is four times or longer than a distance between said first wiring trench and said doping recess.

4. The semiconductor device according to claim 1, further comprising:
   a third wiring trench formed in said second interlevel insulating film, and disposed in plan view overlapping with said first wiring trench;
   a third damascene wiring filling said third wiring trench, and including a third barrier metal film having a diffusion preventive function, covering inner surface of the third wiring trench and defining a third main wiring trench; and a third main wiring layer made of the first metal element, and filling the third main wiring trench;
   a via hole formed between said first wiring trench and said third wiring trench; and
   a via conductor filling said via hole, and including a via barrier metal film having a diffusion preventive function, and covering inner surface of said via hole;
   wherein said impurity doping recess is disposed near said via conductor at a downstream side of said via conductor with respect to electron flow.

5. A semiconductor device comprising:
   a semiconductor substrate;
   a first interlevel insulating film formed above said semiconductor substrate;
   a first trench formed in the first interlevel insulating film;
   a first damascene wiring including a first barrier metal film having a diffusion preventing function, formed covering inner surface of said first trench, and defining a first concave portion, and a first main wiring layer filling said first concave portion and made of a first metal element;
   a second interlevel insulating film formed on said first interlevel insulating film;
   a composite recess formed in said second interlevel insulating film, and including a second trench disposed in plan view overlapping with said first wiring trench, and a via hole formed downward from a bottom surface of said second wiring trench and reaching said first damascene wiring;
   a second damascene wiring including a second barrier metal film having a diffusion preventing function, formed covering inner surface of said composite recess, and defining a second concave portion and a second main wiring layer filling said second concave portion and made of the first metal element;

an impurity doping recess formed in said first or second interlevel insulating film near said first or second damascene wiring, at a downstream side with respect to electron flow, with respect to said second barrier metal film in said via hole, and having an in-plane size larger than a width of said first or second wiring trench adjacent thereto in plane of said first or second interlevel insulating film; and a doping damascene structure including a doping region barrier metal film of a same material as said first or second barrier metal film, formed covering inner surface of said impurity doping recess, and defining a doping region recess and a doping metal region filling said doping region recess, and made of the first metal element doped with a second metal element having migration suppressing function, wherein said doping damascene structure has no circuit function, and a doping concentration of the second metal element in said first or second main wiring layer positioned adjacent to said doping damascene structure lowers with a distance from said doping metal region.

6. The semiconductor device according to claim 5, wherein:
said first metal element is copper, and said second metal element is at least one selected from a group consisting of Ag, Zn, Cd, Sn, Al, Mn, Cr, Si, Pd, and Ti.

7. The semiconductor device according to claim 6, further comprising:
a first insulating copper diffusion preventive film having a copper diffusion preventive function, formed on said first interlevel insulating film and covering said first damascene wiring; and
a second insulating copper diffusion preventive film having a copper diffusion preventive function, formed on said second interlevel insulating film and covering said second damascene wiring,
wherein said via hole passes through said first insulating copper diffusion preventive film.

8. The semiconductor device according to claim 7, further comprising:
an additional impurity doping recess formed in said first or second interlevel insulating film near at an intermediate position of said first or second damascene wiring, and having an in-plane size larger than a width of said first or second wiring trench in plane of said first or second interlevel insulating film; and
an additional doping damascene structure including an additional doping region barrier metal film of a same material as said first or second barrier metal film, formed covering inner surface of said additional impurity doping recess, and defining an additional doping region recess and an additional doping metal region filling said additional doping region recess, and made of the first metal element doped with the second metal element,
wherein a doping concentration of the second metal element in said first or second main wiring layer positioned adjacent to said additional doping damascene structure lowers with a distance from said additional doping metal region.

9. A method for manufacturing a semiconductor device, comprising:
forming a plurality of semiconductor elements on a semiconductor substrate;

forming a first interlevel insulating film above the semiconductor substrate at a first level, the first interlevel insulating film covering the plurality of semiconductor elements;
forming a first wiring trench in the first interlevel insulating film;
forming a first barrier metal film covering inner surface of the first wiring trench, the first barrier metal film having a diffusion preventive function, and defining a first main wiring trench in the first wiring trench;
forming a first main wiring layer formed of first metal element, and filling the first main wiring trench; and
locally doping second metal element having a migration suppressing function into the first main wiring layer, wherein:
said forming the first wiring trench also forms an impurity doping recess in the first interlevel insulating film, the impurity doping recess having an in-plane size larger than a width of said first wiring trench;
said forming the first barrier metal film and defining the first main wiring trench also forms a doping region barrier metal film covering inner surface of said doping recess, and defines a doping region recess;
said forming the first main wiring layer also forms a doping wiring layer made of the first metal element, not filling said impurity doping recess completely and leaving a concave portion on an upper surface;
said locally doping the second metal element into the first main wiring layer includes forming a doping metal layer made of the first metal element and containing the second metal element, on said first main and doping wiring layer, removing said doping metal layer above said first main wiring trench by chemical mechanical polishing, while leaving some of said doping metal layer above said doping region recess, and diffusing the second metal element from said doping metal layer left above the doping region recess into said first main wiring layer by heat treatment; and
the method further comprises:
removing unnecessary metal layer on said first interlevel insulating film by chemical mechanical polishing, leaving a first damascene wiring buried in said first wiring trench and a doping damascene structure constituting the impurity source region buried in said impurity doping recess.

10. The method for manufacturing a semiconductor device according to claim 9, further comprises:
after removing unnecessary metal layer on said first interlevel insulating film, forming an insulating diffusion preventive film on said first interlevel insulating film, covering said first damascene wiring and said doping damascene structure.

11. The method for manufacturing a semiconductor device according to claim 9, wherein:
said forming the first wiring trench also forms a second wiring trench in said first interlevel insulating film,
said impurity doping recess is formed near said first wiring trench and away from said second wiring trench,
said forming the first barrier metal film also forms a second barrier barrier metal film covering inner surface of said second wiring trench, and defines a second main wiring trench;
said forming the first main wiring layer also forms a second main wiring layer made of the first metal element, filling said second main wiring trench;

said removing unnecessary metal layer on said first interlevel insulating film, also leaves a second damascene wiring in said second wiring trench; and said locally doping the second metal element sets concentration of the second metal element in said first damascene wiring higher than concentration of the second metal element in said second damascene wiring by said heat treatment.

12. The method for manufacturing a semiconductor device according to claim 11, wherein a distance between said second wiring trench and said impurity doping recess is four times or longer than a distance between said first wiring trench and said impurity doping recess.

* * * * *